(12) United States Patent
Alvarado et al.

(10) Patent No.: US 6,995,391 B2
(45) Date of Patent: Feb. 7, 2006

(54) ELECTRODE STRUCTURE FOR ELECTRONIC AND OPTO-ELECTRONIC DEVICES

(75) Inventors: Santos F. Alvarado, Rueschlikon (CH); Tilman A. Beierlein, Klichberg (CH); Brian K. Crone, Santa Fe, NM (US); Ute Drechsler, Rueschlikon (CH); Roland Germann, Wangen (CH); Siegfried F. Karg, Adliswil (CH); Peter Mueller, Zurich (CH); Lieike Riel, Rueschlikon (CH); Walter Riess, Thalwil (CH); Beat Ruhstaller, Feusisberg (CH); Paul Seidler, Gattikon (CH); Roland Widmer, Oberglatt (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/499,538

(22) PCT Filed: Nov. 26, 2002

(86) PCT No.: PCT/IB02/04975

§ 371 (c)(1),
(2), (4) Date: Jun. 21, 2004

(87) PCT Pub. No.: WO03/055275

PCT Pub. Date: Jul. 3, 2003

(65) Prior Publication Data

US 2005/0045873 A1    Mar. 3, 2005

(30) Foreign Application Priority Data

Dec. 21, 2001 (EP) .................. 01811260

(51) Int. Cl.
H01L 35/24 (2006.01)
H01L 51/00 (2006.01)
H01L 29/22 (2006.01)

(52) U.S. Cl. .......................... 257/40; 257/99; 257/103

(58) Field of Classification Search ...................... None
See application file for complete search history.

(56) References Cited

U.S. PATENT DOCUMENTS

2002/0028346 A1 * 3/2002 Shi et al. ..................... 428/690

* cited by examiner

*Primary Examiner*—Ngân V. Ngô
(74) *Attorney, Agent, or Firm*—Patterson & Sheridan, LLP; Kin-Wah Tong, Esq.; Wan Yee Cheung, Esq.

(57) ABSTRACT

The present invention discloses an electrode structure for electronic and opto-electronic devices. Such a device comprises a first electrode substantially having a conductive layer (204), a nonmetal layer (206) formed on the conductive layer, a fluorocarbon layer (208) formed on the nonmetal layer, a structure (210) formed on the structure. The electrode may further comprise a buffer layer (205) between the conductive layer and the nonmetal layer.

41 Claims, 5 Drawing Sheets

ELECTRODE STRUCTURE FOR ELECTRONIC AND OPTO-ELECTRONIC DEVICES

This application is a 371 of PCT/IB02/04975 filed Nov. 26, 2002.

TECHNICAL FIELD

The present invention is related to an electrode design for an electronic device. More particularly the invention relates to an electrode modification for electronic and opto-electronic devices.

BACKGROUND OF THE INVENTION

Electronic and opto-electronic devices such as organic light-emitting diodes (OLEDs) are known in the art. Those OLEDs are also referred to as organic electroluminescent (EL) devices which generally comprise an organic electroluminescent material sandwiched between two electrodes. Generally, the organic electroluminescent material is a multilayer structure comprising an electron transport layer, an electroluminescent layer and a hole transport layer. Upon application of an electrical current, the material radiates light generated by recombination of electrons and holes in the organic material. However, the organic luminescent materials are sensitive to impurities, oxygen, and humidity. Further, in some electronic or opto-electronic devices, the electrodes influence the intensity, stability, and reliability of the device. Organic electroluminescent devices (materials and structure) are known in the art as, for example, disclosed in U.S. Pat. No. 4,356,429, U.S. Pat. No. 5,593,788, or U.S. Pat. No. 5,408,109, the disclosures of which are incorporated herein by reference for all purposes.

With multilayer device architectures now well understood and widely used, a remaining performance limitation of OLEDs is the electrode. The main figure of merit for electrode materials is the position of the electrode Fermi energy relative to the relevant organic molecular energy levels. In some applications it is also desirable for an electrode to assist light extraction. Electrodes should also be chemically inert with respect to the adjacent organic material to provide long term stability of the electroluminescent device.

Much attention has been paid to the cathode, largely because good electron injectors are low work function metals which are also chemically reactive and oxidize quickly in atmosphere, limiting the OLED reliability and lifetime. Much less attention has been paid to the optimization of the anode contact, since conventional ITO anodes generally outperform the cathode contact leading to an excess of holes. Due to this excess, and the convenience associated with the conductivity and transparency of indium-tin-oxide (ITO), improved anodes have not been as actively sought as improved cathodes.

Problems concerning sufficient hole injection and operational stability arose with the use of organic electroluminescent devices. Some problems have been relieved by a fluorocarbon treatment of the device's anode. U.S. Pat. No. 6,127,004 relates to a method of forming an electroluminescent device comprising the steps of providing a substrate having a top surface coating with a material including an anode having indium-tin-oxide (ITO); and forming an amorphous conductive layer over the anode by providing a fluorocarbon gas in a radical source cavity and subjecting such fluorocarbon gas to a reduced pressure in a range of 0.1 to 20 mT. Further an RF field is applied across the fluorocarbon gas in the radical source cavity to form a plasma having CFx radicals and the CFx radicals are deposited onto the anode forming an amorphous CFx conductive polymer layer on the anode. Then a plurality of layers over the amorphous CFx conductive polymer layer with such layers including at least one organic electroluminescent layer and a cathode over the electroluminescent layer are formed.

U.S. Pat. No. 6,208,075 relates also to an organic electroluminescent device which has a conductive fluorocarbon polymer layer disposed over an anode and U.S. Pat. No. 6,208,077 shows a thin non-conductive fluorocarbon polymer layer disposed over the anode. The mentioned fluorocarbon polymer layers are applied because of their transport properties and serve therefore as hole injection layers. The fluorocarbon polymer layers adheres preferably on anodes containing oxygen, e.g. ITO, otherwise using other materials lead to unstable device performance.

The international application with international publication number WO 99/39393, presently assigned to the assignee of the instant application, relates to an organic light emitting device having in order an anode, a barrier layer, an anode modification layer, an organic region, and a cathode. The anode modification layer is in direct contact with the organic region. The barrier layer is arranged to separate the anode modification layer form the anode but however this layer interferes the injection as it shows barrier properties.

An opto-electronic device can work either as a top emission device or a bottom emission device, also referred to as back emission device. For bottom emission devices, the anode should be nearly transparent such that the emitted light can pass through the anode.

Indium-tin-oxide (ITO) has been widely applied as anode because it forms nearly transparent layers. ITO has the disadvantage that it can partly react with the layer on top, e.g. the hole transporting organic material. This can lead to a shortening of the lifetime of the device. To circumvent the shortening, usually a buffer layer, e.g. CuPc, is used between the anode and the organic material, but on the other hand the buffer layer has a high resistance and interferes the injection. The use of a fluorocarbon polymer layer, as mentioned above, allows to discard the buffer layer.

For top emission devices molybdenum or platinum have been applied. These materials are not transparent and have a strong optical absorption. The reflection index of platinum is not optimal. Silver (Ag) and aluminum (Al) have a high reflectivity but a lower work function and are therefore unsuitable as anode materials. In general, materials having a high work function are rendered to be best suited as anode material. Low work function materials, e.g. Al, generally are highly chemical active even when covered with a buffer layer, e.g. CuPc, and consequently those materials are therefore unsuitable to form an anode. Moreover, also the combination of such a material and the fluorocarbon polymer layer leads to unreliable performance and therefore to useless devices.

From the above follows that there is still a need in the art for improved structures of electrodes in electronic and opto-electronic devices which show long term stability and high efficiency.

It is therefore an object of the present invention to provide an improved electrode structure for electronic devices comprising an organic material and displays based thereon.

SUMMARY AND ADVANTAGES OF THE INVENTION

In accordance with the present invention, there is provided an electronic device comprising a first electrode substantially having a conductive layer, a nonmetal layer formed on the conductive layer, a fluorocarbon layer formed on the nonmetal layer, a structure formed on the fluorocarbon layer, and a second electrode formed on the structure.

The electronic device can further comprise a buffer layer between the conductive layer and the nonmetal layer. Such a buffer layer reduces advantageously the reactions between the first electrode and further layers. In particular oxidation processes can be avoided.

In a preferred embodiment, the conductive layer comprises aluminum (Al). Aluminum is normally highly reflective but also reactive. However, having the nonmetal layer or the mentioned buffer layer in combination with the nonmetal layer on top of the conductive layer than it turns out that electroluminescent devices with excellent properties and characteristics can be designed.

The nonmetal layer can comprise an oxide. Oxides are plentifully available or can be formed from many materials or compounds. The oxide can be based on a material selected from one of the groups: 3d transition metal group, IIIA group, IVA group, rare earth metal group, or a combination thereof.

When the nonmetal layer is an oxide different from a potential oxide that can be formed by the conductive layer, also referred to as foreign oxide, then the advantage occurs that electrical and optical properties, e.g. injection and transparency, of the electrode can be tailored. For example, when the conductive layer is formed from Al then the potential oxide that can be formed or created by the conductive layer is aluminum oxide. It is a fact that aluminum oxide has a higher resistance than, e.g., nickel oxide ($NiO_x$). Thus using $NiO_x$ as the foreign oxide to form the nonmetal layer shows better hole injection properties than aluminum oxide. The combination of the conductive layer having a high reflectivity and the nonmetal layer supporting hole injection additionally leads to reliable and significantly improved electroluminescent devices with improved light output.

Depending on the nature of the conductive layer it is advantageous if the nonmetal layer has a thickness in the range of one monolayer to 20 nm, because then the electronic device shows excellent long term stability and high efficiency. In electroluminescent devices (OLEDs), e.g., active driven devices, higher values of thickness are often associated with higher driving voltages.

The conductive layer can comprises a metal, a semiconductor, or an organic conductor. Moreover, the conductive layer can comprise an optical reflective material. Preferred materials for the conductive layer, i.e. for the electrode, is aluminum (Al) or silver (Ag). Those materials come into focus when an oxide or foreign oxide is used as nonmetal layer on the conductive layer.

The conductive layer can form a mirror-like surface. That means the anode works as a mirror and reflects the emitted light to intensify the light output. This concept works for top as well as bottom emitting devices.

Under the term opto-electronic device is understood any device that works as an electrical-to-optical or optical-to-electrical transducer, or an instrument that uses such a device in its operation.

The electronic device can comprise a substrate that is in contact with the conductive layer or the structure. The substrate can be any material including glass, i.e. a transparent material for top emission devices; Si, or plastic, i.e. an opaque material for bottom devices. The substrate can be used as a basis for forming an electronic device.

The electronic device can be part of an electroluminescent device, a transistor, or a sensor. This shows that the electrode design can be broadly used. The structure is however not limited to the mentioned applications. It is also not limited to the use with organic structures, but it can be used in connection with the following structures: organic/inorganic, organic-inorganic hybrid, or inorganic. Moreover, the electrode design with the structure is applicable in a broad variety of electronic and opto-electronic applications.

The present invention also relates to a method for forming the electronic device. The method comprising the steps of: providing a conductive layer to serve as a first electrode; forming a nonmetal layer on the first electrode, depositing a fluorocarbon layer onto the nonmetal layer, forming a plurality of layers as structure on the fluorocarbon layer, and forming a second electrode on the structure.

DESCRIPTION OF THE DRAWINGS

Preferred embodiments of the invention are described in detail below, by way of example only, with reference to the following schematic drawings.

The drawings are provided for illustrative purpose only and do not necessarily represent practical examples of the present invention to scale.

DETAILED DESCRIPTION OF THE INVENTION

Although the present invention is applicable in a broad variety of electronic and opto-electronic applications it will be described with the focus put on an application to an organic electroluminescent device, i.e. an organic light-emitting diode (OLED), and an organic transistor.

Before embodiments of the present invention are described, the configuration of a prior art electroluminescent device is addressed.

Figure 1:
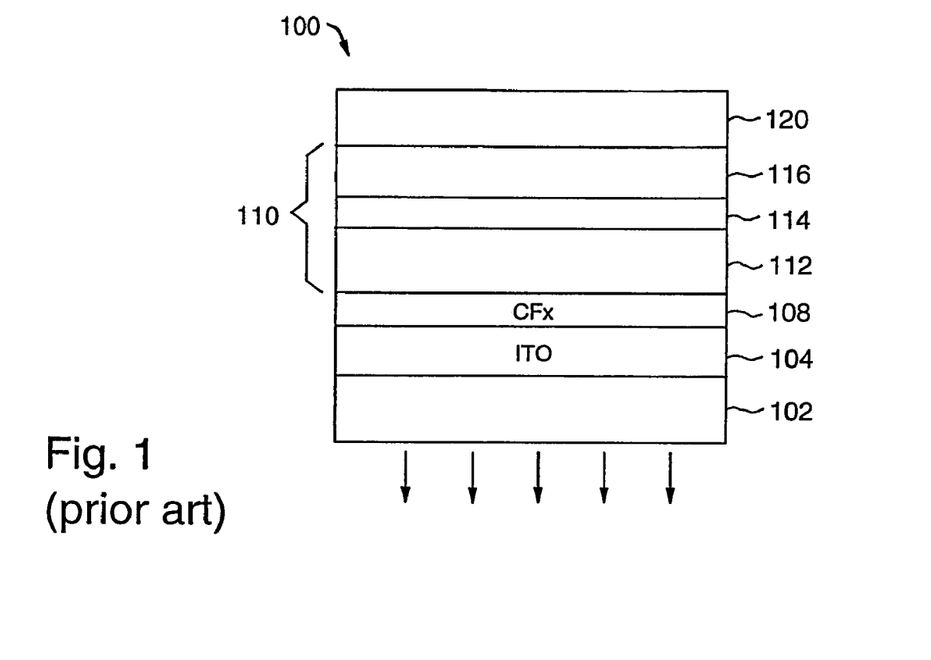
FIG. 1 shows a schematic illustration of an organic electroluminescent device of the prior art.

FIG. 1 shows an organic electroluminescent device 100 that has a substrate 102, on which is disposed an indium-tin-oxide (ITO) anode 104. The substrate 102 and the ITO anode 104 are light transparent. A polymer layer 108 is arranged in direct contact with the ITO anode 104. An organic light-emitting structure 110 is formed between the ITO anode 104 that is coated with the polymer layer 108 and a cathode 120. The organic light-emitting structure 110 is comprised of, in sequence, an organic hole-transporting layer 112, an organic light-emitting layer 114, and an organic electron-transporting layer 116. When an electrical potential difference is applied between the anode 104 and the cathode 120 such that the anode 104 is electrically positive relative to the cathode 120, the cathode 120 will inject electrons into the electron-transporting layer 116, and the electrons will traverse the electron-transporting layer 116 and the light-emitting layer 114. At the same time, holes will be injected from the anode 104 into the hole-transporting layer 112, and the holes will migrate across layer 112, and eventually recombine with electrons near the interface between the hole-transporting layer 112 and the light-emitting layer 114. When electrons from the conduction band recombine radiatively with holes from the valence band, photons can be emitted through the light-transmissive anode 104 and substrate 102, as indicated by the arrows, for viewing by an observer.

The polymer layer 108 can be prepared by plasma polymerization of a fluorocarbon gas in a RF plasma. The fluorocarbon polymer is a teflon-like polymer and is substantially formed of carbon and fluorine. It may also contain hydrogen and/or a small amount of impurities such as nitrogen, oxygen, etc. The thickness of the polymer layer is so selected that it would have a full coverage on the underlying conductive layer, and that its low conductivity has no negative impacts on device performance.

Figure 2A:
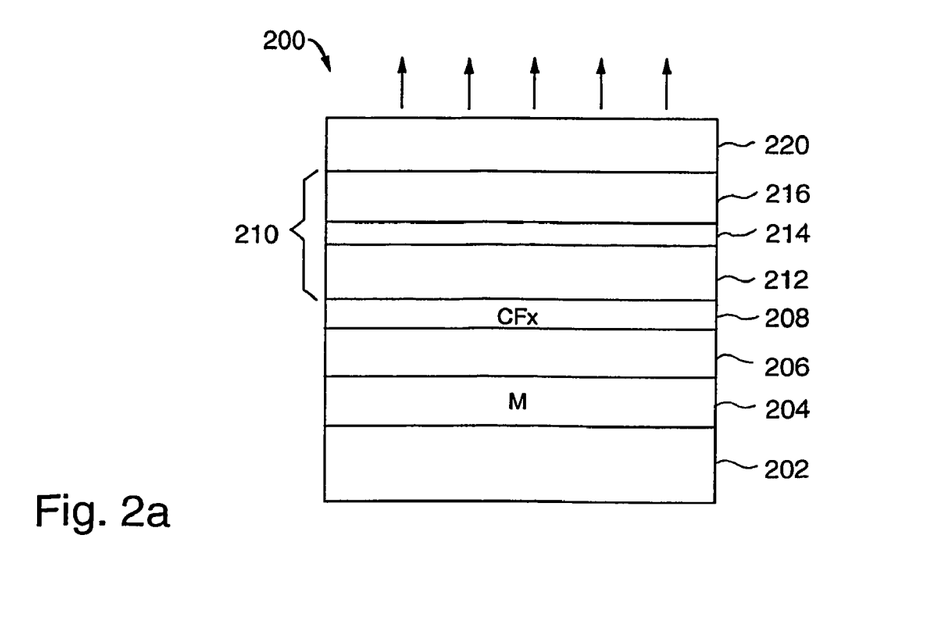
FIG. 2a shows a schematic illustration of a first embodiment of an organic electroluminescent device.

FIG. 2a shows a schematic illustration of a first embodiment of an organic electroluminescent device 200. The organic electroluminescent device 200, that here is a top emission device, has a substrate 202, on which is disposed a first electrode 204, also referred to as anode 204. The anode 204 comprises a layer of conductive and highly reflective material, labeled with M, so as to provide a mirror-like surface. A nonmetal layer 206 comprising substantially an oxide is formed on the anode 204. Moreover, on the nonmetal layer 206 a polymer layer 208 substantially comprising fluorocarbon is formed. An organic light-emitting structure 210 is formed between the nonmetal layer 206 that is coated with the fluorocarbon layer 208 and a cathode 220. The organic light-emitting structure 210 is comprised of, in sequence, an organic hole-transporting layer 212, an organic light-emitting layer 214, and an organic electron-transporting layer 216. The described structure is distinctive over the prior art as shown with reference to FIG. 1. The nonmetal layer 206 is arranged between the anode 204 and the polymer layer 208.

The polymer layer 208 is prepared by plasma polymerization of a fluorocarbon gas in a RF plasma. Also possible is to apply chemical vapor deposition (CVD).

The anode 204 comprises a layer of conductive and highly reflective material, preferably Al or Ag, so as to provide a mirror-like surface. The nonmetal layer 206 comprises an oxide that here is different form the oxide that the conductive and highly reflective material forms if it comes into contact with oxygen or under ambient, e.g. ITO, $NiO_x$. Several methods of deposition of the nonmetal layer 206 are listed below:

chemical vapor deposition (CVD), including plasma-enhanced chemical vapor deposition (PECVD);
sputter deposition or reactive (e.g. in an oxygen environment) sputter deposition;
thermal evaporation;
electron-beam evaporation;
oxygen plasma (plasma-assisted oxidation);
thermal annealing in an oxidizing environment;
UV-ozone treatment;
wet-chemical oxidation;
electrochemical oxidation.

The substrate 202 is used as a basis and should be electrically insulated. As the presented device is a top emission device, i.e. the generated light is reflected at the mirror-like surface of the anode 204 and transmitted through the cathode 220, as indicated by the arrows, the substrate can be opaque. In that case the cathode 220 should be light-transmissive.

The present invention is not restricted to top emission devices and can of course be applied to bottom emission devices as well with all its advantages. Then the anode 204 should have transmissive characteristics.

When a bottom emission device or architecture is desired, then the anode 204 as well as the substrate 202 should be light-transmissive. In that case the anode 204 suitably comprises semi-transparent materials or metal films. These can comprise a transparent conducting oxide, such as indium-tin-oxide, doped tin oxide, or aluminum doped zinc oxide. These materials should be suitably deposited on the transparent substrate 202 such as glass quartz or a polymer substrate, e.g. polyethylene terephthalate or polyvinyl acetate.

A variety of compositions for the organic light-emitting structure 210 can be utilized.

Hole transport layers and Hole injection layers: The following materials are suited as hole injection layer and organic hole-transporting layer 212. Materials containing aromatic amino groups, like tetraphenyldiaminodiphenyl (TPD-1, TPD-2, or TAD) and NPB (see C. Tang, SID Meeting San Diego, 1996, and C. Adachi et al. Applied Physics Letters, Vol. 66, p. 2679, 1995), TIA, NIPC, TPM, DEH (for the abbreviations see for example: P. Borsenberger and D. S. Weiss, Organic Photoreceptors for Imaging Systems, Marcel Dekker, 1993). These aromatic amino groups can also be incorporated in polymers, starburst (for example: TCTA, m-MTDATA, see Y. Kuwabara et al., Advanced Materials, 6, p. 677, 1994, Y. Shirota et al., Applied Physics Letters, Vol. 65, p. 807, 1994) and spiro compounds.

Further examples are: Copper(II) phthalocyanine (CuPc), (N,N'-diphenyl-N,N'-bis-(4-phenylphenyl)-1,1'-biphenyl-4, 4'-diamine), distyryl arylene derivatives (DSA), naphthalene, naphthostyrylamine derivatives (e.g. NSD), quinacridone (QA), poly(3-methylthiophene) (P3MT) and its derivatives, perylene and perylene derivatives, polythiophene (PT), 3,4,9,10-perylenetetracarboxylic dianhydride (PTCDA), PPV and some PPV derivatives, for example MEH-PPV, poly(9-vinylcarbazole) (PVK), discotic liquid crystal materials (HPT).

Electron transport/Emitting materials are: $Alq_3$, $Gaq_3$, $Inq_3$, $Scq_3$, (q refers to 8-hydroxyquinolate or it's derivatives) and other 8-hydroxyquinoline metal complexes such as $Znq_2$, $Beq_2$, $Mgq_2$, $ZnMq_2$, $BeMq_2$, BAlq, and $AlPrq_3$, for example. These materials can be used as the organic electron-transporting layer 216 or organic light-emitting layer 214.

Other classes of electron transporting materials are electron-deficient nitrogen-containing systems, for example oxadiazoles like PBD (and many derivatives), and triazoles, for example TAZ (1,2,4-triazole).

These functional groups can also be incorporated in polymers, starburst and spiro compounds. Further classes are materials containing pyridine, pyrimidine, pyrazine and pyridazine functionalities.

Finally, materials containing quinoline, quinoxaline, cinnoline, phthalazine and quinaziline functionalities are well known for their electron transport capabilities.

Other materials are didecyl sexithiophene (DPS6T), bis-triisopropylsilyl sexithiophene (2D6T), azomethin-zinc complexes, pyrazine (e.g. BNVP), styrylanthracene derivatives (e.g. BSA-1, BSA-2), non-planar distyrylarylene derivatives, for example DPVBi (see C. Hosokawa and T. Kusumoto, International Symposium on Inorganic and Organic Electroluminescence 1994, Hamamatsu, 42), cyano-substituted polymers such as cyano-PPV (PPV means poly(p-phenylenevinylene)) and cyano-PPV derivatives.

The following materials are particularly well suited as Emission layers and Dopants: Anthracene, pyridine derivatives (e.g. ATP), Azomethin-zinc complexes, pyrazine (e.g. BNVP), styrylanthracene derivatives (e.g. BSA-1, BSA-2), Coronene, Coumarin, DCM compounds (DCM1, DCM2), distyryl arylene derivatives (DSA), alkyl-substituted distyrylbenzene derivatives (DSB), benzimidazole derivatives (e.g. NBI), naphthostyrylamine derivatives (e.g. NSD), oxadiazole derivatives (e.g. OXD, OXD-, OXD-7), N,N,N',N'-tetrakis(m-methylphenyl)-1,3-diaminobenzene (PDA), perylene and perylene derivatives, phenyl-substituted cyclopentadiene derivatives, 12-phthaloperinone sexithiophene (6T), polythiophenes, quinacridones (QA) (see T. Wakimoto et al., International Symposium on Inorganic and Organic Electroluminescence, 1994, Hamamatsu, 77), and substituted quinacridones (MQA), rubrene, DCJT (see for example: C. Tang, SID Conference San Diego; Proceedings, 1996, 181), conjugated and non-conjugated polymers, for example PPV and PPV derivatives, dialkoxy and dialkyl PPV derivatives, for example MEH-PPV (poly (2-methoxy)-5-(2'-ethylhexoxy)-1,4-phenylene-vinylene), poly(2,4-bis(cholestanoxyl)-1,4-phenylene-vinylene) (BCHA-PPV), and segmented PPVs (see for example: E. Staring in International Symposium on Inorganic and Organic Electroluminescence, 1994, Hamamatsu, 48, and T. Oshino et al. in Sumitomo Chemicals, 1995 monthly report).

There are many other organic materials known as being good light emitters, charge transport materials, and charge injection materials, and many more will be discovered. These materials can be used as well for making light-emitting structures.

The organic hole-transporting layer 212 comprises at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine.

The organic light-emitting layer 214 comprises of a luminescent or fluorescent material or material combination (host and dopant(s)), where electroluminescence is produced as a result of electron-hole pair recombination in this region. In the simplest construction, the luminescent layer comprises of a single component, that is a pure material with a high fluorescent efficiency. A well known material is tris (8-quinolinato) aluminum, (Alq).

The cathode electrode 220 comprises a metal or electrode configuration with a low work function (e.g., less than 4.0 eV, preferably less than 3.5 eV) selected from alkali metals, alkaline earth metal or rare earth metal, combined compounds, such as LiF/Al, $Li_2O$/Al, or alloys thereof. Preferred metals are calcium or alloys such as magnesium/silver; lithium/aluminum; or magnesium/aluminum. These cathode configurations provide low work function and thus enhanced quantum efficiency for the device.

The same reference numbers are used to denote the same or like parts.

Figure 2B:
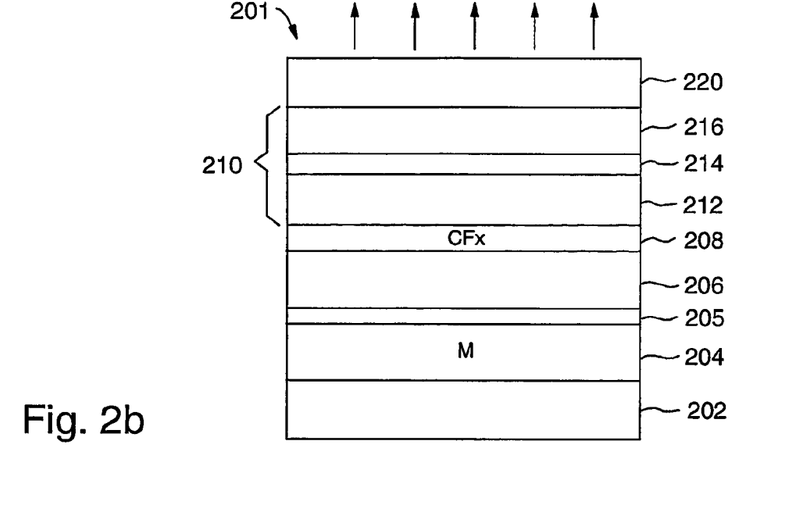
FIG. 2b shows a schematic illustration of a second embodiment of an organic electroluminescent device.

FIG. 2b shows a schematic illustration of a second embodiment of an organic 202, on which is disposed the anode 204. The nonmetal layer 206 is formed on the anode 204. Between the nonmetal layer 206 and the anode 204 is formed a buffer layer 205. Suitable buffer layer materials are Ti, Ni, Pt, or ITO. The buffer layer 205 should be a thin layer with a thickness of a few Angstrom to several nanometers. This buffer layer 205 reduces the chemical reactions and avoids interdiffusion between the conductive and highly reflective layer of the anode 204 and other layers. In particular oxidation and interdiffusion processes can be avoided. The organic light-emitting structure 210 is formed between the nonmetal layer 206 and the cathode 220 as described above.

Figure 3A:
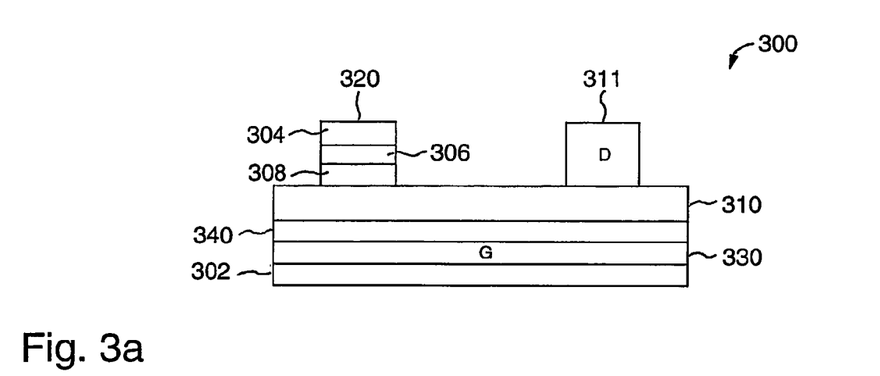
FIG. 3a shows a schematic illustration of an example of an organic transistor.

FIG. 3a shows a schematic illustration of an example of an organic transistor 300. The organic transistor 300 comprises a substrate 302, a gate layer 330 being a metal, a gate dielectric layer 340, e.g. SiO, and an organic structure 310. Further, the organic transistor 300 comprises as the known connectors a source electrode 320 and a drain electrode 311 which are arranged on the organic structure 310. Moreover, the source electrode 320 comprises a conductive layer 304, a nonmetal layer 306, and a polymer layer 308, which is in direct contact with the organic structure 310. In another example the drain electrode 311 comprises the conductive layer 304, the nonmetal layer 306, and the polymer layer 308 (not shown). The drain electrode 311 and the source electrode 320 can also have the same structure.

Figure 3B:
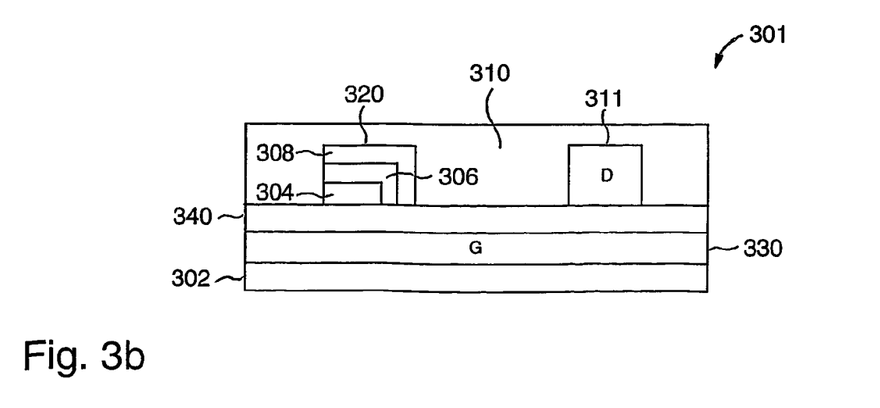
FIG. 3b shows a schematic illustration of an example of an organic transistor.

FIG. 3b shows a schematic illustration of an example of a further organic transistor 301. The same reference numbers are used to denote the same or like parts. The further organic transistor 301 comprises the substrate 302, the gate layer 330, the gate dielectric layer 340, and the organic structure 310. The difference to FIG. 3a is that the source electrode 320 and the drain electrode 311 are buried in the organic structure 310. The conductive layer 304, the nonmetal layer 306, and the polymer layer 308 are connected to the gate dielectric layer 340.

Figure 4:
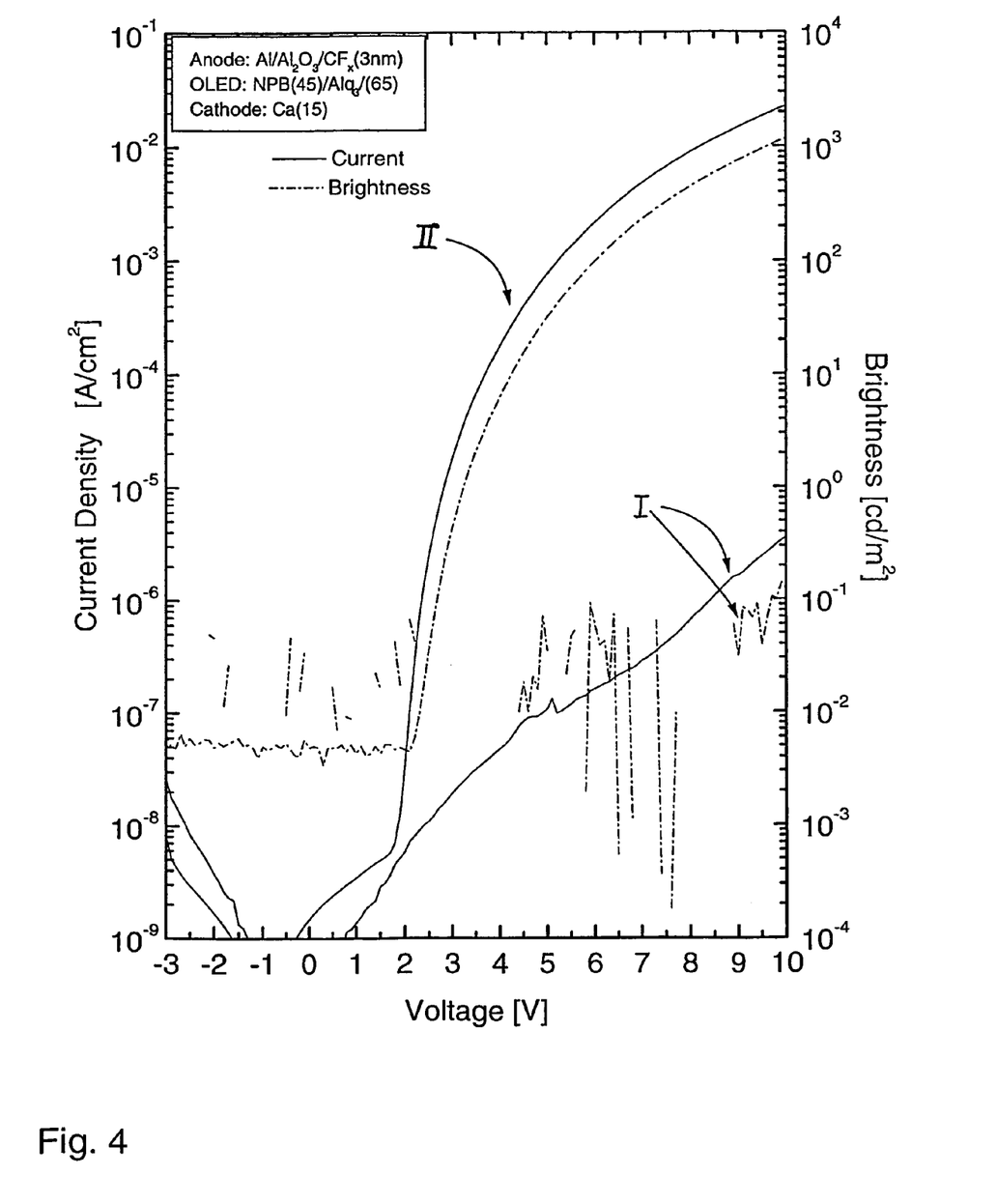
FIG. 4 shows a diagram displaying the current-voltage relationship of a first tested electroluminescent device and the current-voltage and brightness-voltage relationship of second tested electroluminescent devices.

FIG. 4 shows a diagram displaying the current-voltage relationship of a first tested electroluminescent device, labeled with I, and the current-voltage (thick curve) and brightness-voltage (thin curve) relationship of second tested electroluminescent device, labeled with II, according to the present invention. The second tested electroluminescent device is structured as follows: anode arrangement Al/$Al_2O_3$/$CF_x$ (3 nm); organic light-emitting structure: NPB (45 nm)/$Alq_3$(65 nm); cathode Ca(15 nm). The second tested electroluminescent device shows a much better performance, especially in brightness, than the first tested electroluminescent device having a known configuration.

Figure 5:
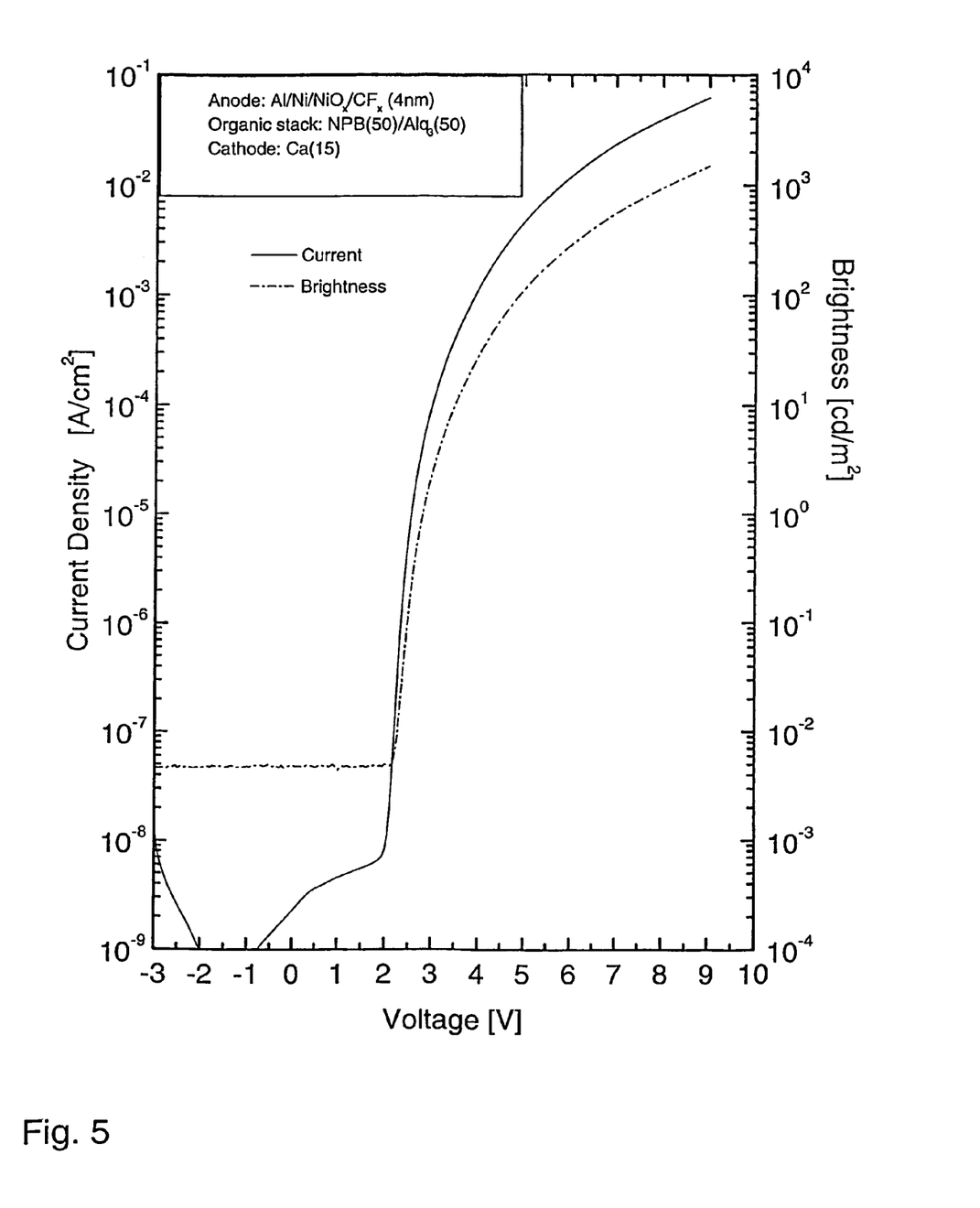
FIG. 5 shows a diagram displaying the current-voltage and brightness-voltage relationship of a third tested electroluminescent devices.

FIG. 5 shows a diagram displaying the current-voltage (thick curve) and brightness-voltage (thin curve) characteristic of a third tested electroluminescent device having the following structure: anode arrangement AlNi/$NiO_x$/$CF_x$ (4 nm); organic light-emitting structure: NPB(50 nm)/$Alq_3$(50 nm); cathode Ca(15 nm). The third tested electroluminescent device having the buffer layer comprising Ni and the nonmetal layer comprising $NiO_x$ shows even steeper characteristics compared to FIG. 4 indicating an excellent performance of the third tested electroluminescent device.

Figure 6:
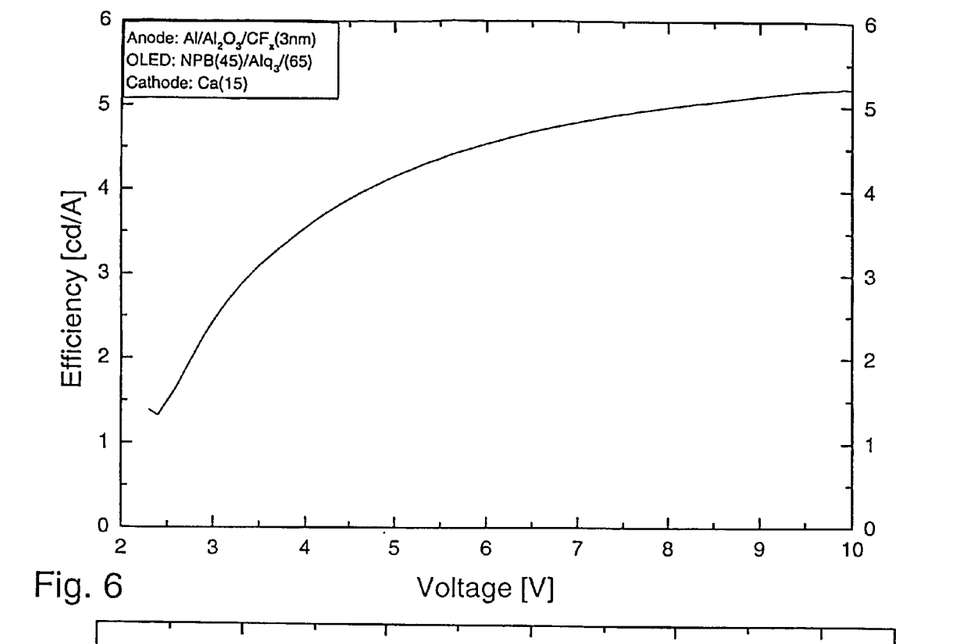
FIG. 6 shows a diagram displaying the efficiency-voltage relationship of the second tested electroluminescent device.

FIG. 6 shows a diagram displaying the efficiency-voltage relationship of the second tested electroluminescent device.

The graph indicates that the second tested electroluminescent device is best suited for OLEDs.

Figure 7:
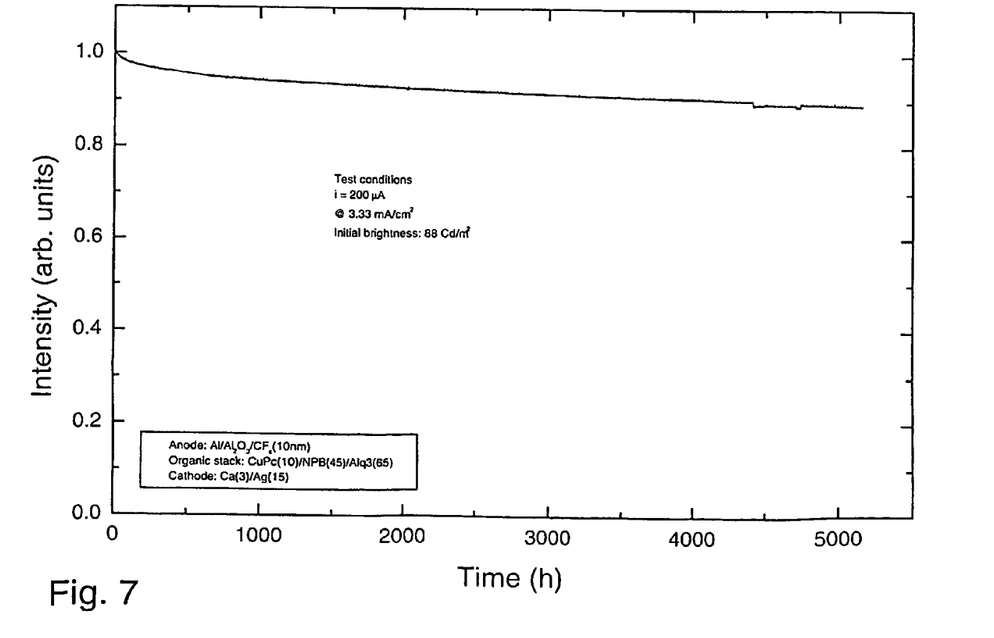
FIG. 7 shows a standardized diagram of the lifetime of a fourth tested electroluminescent device.

FIG. 7 shows a standardized diagram of the lifetime of a fourth tested electroluminescent device. The fourth tested electroluminescent device is structured as follows: anode arrangement Al/Al$_2$O$_3$/CF$_x$ (10 nm); organic light-emitting structure: CuPu(10 nm)/NPB(45 nm)/Alq$_3$(65 nm); cathode Ca(3 nm)/Ag(15 nm). The extrapolated lifetime, i.e. the time until the device shows half the brightness compared to the initial brightness under constant current conditions, is about 28 years, which speaks for a highly reliable electroluminescent device. The initial brightness was 88 Cd/m$^2$.

EXAMPLE

The following example is presented for further understanding. For purposes of brevity, the materials and the layers formed therefrom will be abbreviated as follows:
ITO: indium-tin-oxide
NPB: 4,4'-bis-[N-(1-naphthyl)-N-phenylamino]-bi-phenyl (hole-transporting layer)
Alq: tris (8-quinolinolato-N1,08)-aluminum (electron-transporting layer; functioning here as a combined light-emitting layer and electron-transporting layer)
MgAg: magnesium silver at a ratio of 10:1 by volume
An organic light-emitting structure was constructed in the following manner:
1a) evaporation of Ti on glass (substrate)
1b) evaporation of Al on Ti/glass
1c) deposition of ITO, optional a buffer layer of Pt or Ti can be formed between Al and ITO
2) insertion of the structure in a plasma etch/deposition machine for
  a) oxygen plasma treatment for cleaning and oxidation (also for ITO);
  b) deposition of a 3 nm fluorocarbon polymer by plasma polymerization of a CHF$_3$ gas in a 13.6 MHz plasma;
3) transfer to an OLE material deposition chamber
  a) a 50–60 nm thick NPB hole-transporting layer was deposited on the fluorocarbon polymer layer by conventional thermal vapor deposition;
  b) a 65 nm thick Alq electron-transporting and light-emitting layer was deposited on the NPB layer by conventional thermal vapor deposition;
  c) a 10–20 nm Ca layer was deposited thereon;
  d) a 20 nm thick MgAg layer was deposited on the Ca layer by co-evaporation from two sources (Mg and Ag).

Any disclosed embodiment may be combined with one or several of the other embodiments shown and/or described. This is also possible for one or more features of the embodiments.

What is claimed is:

1. An electroluminescent device (OLED), comprising
a first electrode having a conductive layer (204);
a nonmetal layer (206) formed on the conductive layer (204);
a fluorocarbon layer (208) formed on the nonmetal layer (206);
a light-emitting structure (210) formed on the fluorocarbon layer (208); and
a second electrode (220) formed on the light-emitting structure (210).

2. The device according to claim 1 further comprising a buffer layer (205) between the conductive layer (204) and the nonmetal layer (206).

3. The device according to claim 1 wherein the nonmetal layer (206) comprises an oxide.

4. The device according to claim 3, wherein the oxide is based on a material selected from one of the groups: 3d transition metal group, IIIA group, IVA group, rare earth metal group, or a combination thereof.

5. The device according to claim 3, wherein the oxide of the nonmetal layer (206) is different from a potential oxide formable by the conductive layer (204).

6. The device according to claim 1, wherein the nonmetal layer (206) has a thickness in the range of one monolayer to 20 nm.

7. The device according to claim 1, wherein the conductive layer (204) comprises an optical reflective material.

8. The device according to claim 1, wherein the conductive layer (204) forms a mirror-like surface.

9. The device according to claim 1, wherein the conductive layer (204) comprises aluminum (Al).

10. The device according to claim 1 further comprising a substrate (202) being in contact with the conductive layer (204) or the structure (210).

11. Method for forming an electroluminescent device (OLED) according to the any of the preceding claims comprising the steps of:
providing a conductive layer (204) to serve as a first electrode;
forming a nonmetal layer (206) on the conductive layer (204);
depositing a fluorocarbon layer (208) onto the nonmetal layer (206);
forming a plurality of layers as a light-emitting structure (210) on the fluorocarbon layer (208); and
forming a second electrode (220) on the light-emitting structure (210).

12. The device according to claim 2, wherein the nonmetal layer (206) has a thickness in the range of one monolayer to 20 nm.

13. The device according to claim 3, wherein the nonmetal layer (206) has a thickness in the range of one monolayer to 20 nm.

14. The device according to claim 4, wherein the nonmetal layer (206) has a thickness in the range of one monolayer to 20 nm.

15. The device according to claim 5, wherein the nonmetal layer (206) has a thickness in the range of one monolayer to 20 nm.

16. The device according to claim 2, wherein the conductive layer (204) comprises an optical reflective material.

17. The device according to claim 3, wherein the conductive layer (204) comprises an optical reflective material.

18. The device according to claim 4, wherein the conductive layer (204) comprises an optical reflective material.

19. The device according to claim 5, wherein the conductive layer (204) comprises an optical reflective material.

20. The device according to claim 6, wherein the conductive layer (204) comprises an optical reflective material.

21. The device according to claim 2, wherein the conductive layer (204) forms a mirror-like surface.

22. The device according to claim 3, wherein the conductive layer (204) forms a mirror-like surface.

23. The device according to claim 4, wherein the conductive layer (204) forms a mirror-like surface.

24. The device according to claim 5, wherein the conductive layer (204) forms a mirror-like surface.

25. The device according to claim 6, wherein the conductive layer (204) forms a mirror-like surface.

26. The device according to claim 7, wherein the conductive layer (204) forms a mirror-like surface.

27. The device according to claim 2, wherein the conductive layer (204) comprises aluminum (Al).

28. The device according to claim 3, wherein the conductive layer (204) comprises aluminum (Al).

29. The device according to claim 4, wherein the conductive layer (204) comprises aluminum (Al).

30. The device according to claim 5, wherein the conductive layer (204) comprises aluminum (Al).

31. The device according to claim 6, wherein the conductive layer (204) comprises aluminum (Al).

32. The device according to claim 7, wherein the conductive layer (204) comprises aluminum (Al).

33. The device according to claim 8, wherein the conductive layer (204) comprises aluminum (Al).

34. The device according to claim 2 further comprising a substrate (202) being in contact with the conductive layer (204) or the structure (210).

35. The device according to claim 3 further comprising a substrate (202) being in contact with the conductive layer (204) or the structure (210).

36. The device according to claim 4 further comprising a substrate (202) being in contact with the conductive layer (204) or the structure (210).

37. The device according to claim 5 further comprising a substrate (202) being in contact with the conductive layer (204) or the structure (210).

38. The device according to claim 6 further comprising a substrate (202) being in contact with the conductive layer (204) or the structure (210).

39. The device according to claim 7 further comprising a substrate (202) being in contact with the conductive layer (204) or the structure (210).

40. The device according to claim 8 further comprising a substrate (202) being in contact with the conductive layer (204) or the structure (210).

41. The device according to claim 9 further comprising a substrate (202) being in contact with the conductive layer (204) or the structure (210).

* * * * *

UNITED STATES PATENT AND TRADEMARK OFFICE
CERTIFICATE OF CORRECTION

| | |
|---|---|
| PATENT NO. | : 6,995,391 B2 |
| APPLICATION NO. | : 10/499538 |
| DATED | : February 7, 2006 |
| INVENTOR(S) | : Santos F. Alvarado et al. |

It is certified that error appears in the above-identified patent and that said Letters Patent is hereby corrected as shown below:

Title page, item (75), correct the spelling of inventor name "Lieike Riel" to --Heike Riel--.

Signed and Sealed this
Thirtieth Day of April, 2013

Teresa Stanek Rea
*Acting Director of the United States Patent and Trademark Office*